United States Patent
Sawada et al.

(10) Patent No.: US 6,930,382 B2
(45) Date of Patent: Aug. 16, 2005

(54) SEMICONDUCTOR DEVICE AND METHOD OF MANUFACTURING THE SAME

(75) Inventors: Kanako Sawada, Yokohama (JP); Keiichi Sasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/875,190

(22) Filed: Jun. 25, 2004

(65) Prior Publication Data

US 2004/0235234 A1 Nov. 25, 2004

Related U.S. Application Data

(62) Division of application No. 10/327,981, filed on Dec. 26, 2002, now Pat. No. 6,841,469.

(30) Foreign Application Priority Data

Dec. 27, 2001 (JP) ........................................ 2001-398383

(51) Int. Cl.[7] .............................................. H01L 23/02
(52) U.S. Cl. ........................ 257/698; 257/777; 438/14; 438/667; 438/926
(58) Field of Search ................................ 257/777, 621, 257/685, 686, 723, 737, 738, 758, 774, 778, 780; 438/109, 613, 624, 629, 637, 638, 639, 667, 672, 401, 973, 975, 107

(56) References Cited

U.S. PATENT DOCUMENTS

| | | | |
|---|---|---|---|
| 5,273,938 A | * | 12/1993 | Lin et al. ..................... 438/107 |
| 5,960,313 A | | 9/1999 | Jun |
| 6,087,719 A | | 7/2000 | Tsunashima |
| 6,239,495 B1 | | 5/2001 | Sakui et al. |
| 6,365,504 B1 | | 4/2002 | Chien et al. |
| 6,391,706 B2 | | 5/2002 | Wu et al. |
| 6,534,370 B2 | | 3/2003 | Park |
| 6,624,506 B2 | * | 9/2003 | Sasaki et al. ................ 257/686 |
| 6,677,235 B1 | | 1/2004 | Yegnashankaran et al. |
| 6,809,421 B1 | * | 10/2004 | Hayasaka et al. ........... 257/777 |
| 6,841,469 B2 | * | 1/2005 | Sawada et al. .............. 438/629 |

OTHER PUBLICATIONS

Sze, Physics Of Semiconductor Devices, 2nd Edition, pp. 39–41.*

* cited by examiner

Primary Examiner—Olik Chaudhuri
Assistant Examiner—Belur V. Keshavan
(74) Attorney, Agent, or Firm—Finnegan, Henderson, Farabow, Garrett & Dunner, L.L.P.

(57) ABSTRACT

A semiconductor device includes a first substrate including an element, a first plug penetrating through the first substrate, made of a conductive material, and electrically connected with the element, a second substrate provided above the first substrate, and electrically connected with the element via the first plug, and a second plug penetrating through the first substrate, made of a non-dielectric material, and being not electrically connected with the second substrate.

20 Claims, 10 Drawing Sheets

SEMICONDUCTOR DEVICE AND METHOD OF MANUFACTURING THE SAME

CROSS-REFERENCE TO RELATED APPLICATIONS

This is a divisional of application Ser. No. 10/327,981, filed Dec. 26, 2002, now U.S. Pat. No. 6,841,469 which claims priority from Japanese Patent Application No. 2001-398383, filed Dec. 27, 2001. The entire contents of these applications are incorporated herein by reference.

BACKGROUND OF THE INVENTION

1. Field of the Invention

The present invention relates to a semiconductor device, which uses a through plug for connection between substrates, and a method of manufacturing the same.

2. Description of the Related Art

Recently, multi-chip semiconductor devices have attracted special interest. Multi-chip semiconductor devices can improve the performance of the entire devices, using several chips. A chip direct-laminated type multi-chip semiconductor device has been proposed as one of the above multi-chip semiconductor devices. In this kind of multi-chip semiconductor device, several chips are electrically connected to each other using a plug (chip through plug) penetrating through a chip.

Figure 12A:
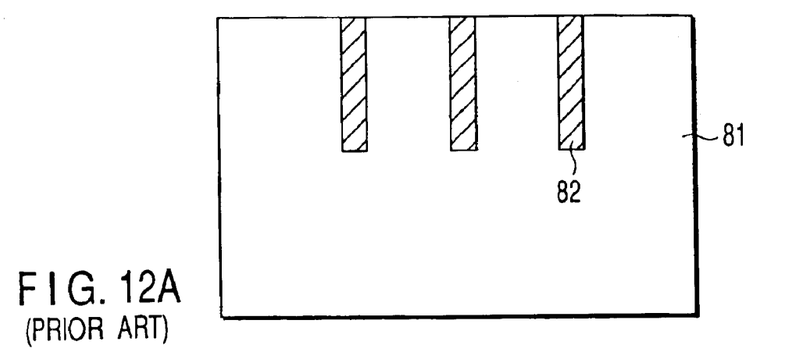
FIGS. 12A to 12C are cross-sectional views showing the process of forming a conventional chip through plug.

In order to form the chip through plug, first, a metal plug 82 is buried and formed in the surface of a Si substrate (Si wafer) 81 (see FIG. 12A). The back surface of the Si substrate 81 is previously ground by mechanical polishing with the use of a grinding wheel having a high grinding speed directly before the metal plug 82 is exposed (see FIG. 12B). Thereafter, the Si substrate 81 is thinned by wet or dry etching or CMP (Chemical Mechanical Polishing) until the metal plug 82 projects from the back surface of the substrate by several $\mu$m (see FIG. 12C).

Actually, before the metal plug 82 is buried and formed, a trench inner wall in which the metal plug 82 is buried is coated with a dielectric film, etc. Here, the dielectric film, etc are omitted for simplification of the explanation.

Figure 12B:
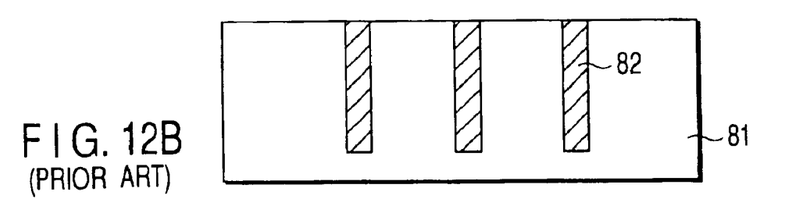
Figure 13:
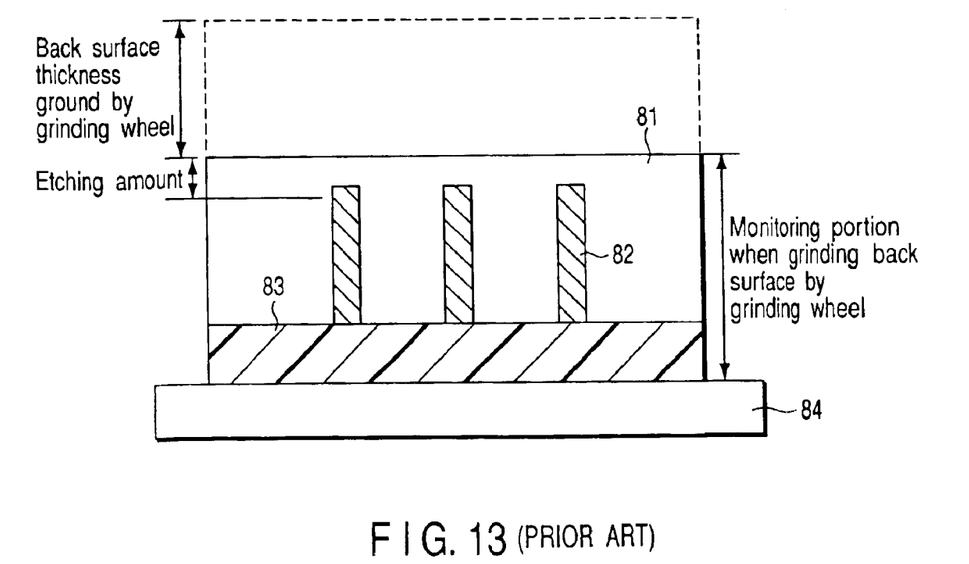
FIG. 13 is a cross-sectional view to explain the details of the process of grinding a back surface by a grinding wheel in the process of forming the conventional chip through plug shown in FIGS. 12A to 12C.

In the back surface grinding process by the grinding wheel shown in FIG. 12B, a grinding tape 83 is stuck onto the Si substrate 81, as illustrated in FIG. 13. In a state where a grinding table 84 is placed on the grinding tape 83, the back surface of the Si substrate 81 is ground.

In order to monitor the back surface thickness (amount) ground by the grinding wheel, the total thickness of the Si substrate 81 and the grinding tape 83 is measured using a contact type thickness monitor.

However, non-uniformity (e.g., ±10 $\mu$m) occurs in the thickness of the grinding tape 83; for this reason, non-uniformity also occurs place in the thickness of the back surface ground by the grinding wheel.

BRIEF SUMMARY OF THE INVENTION

A semiconductor device according to an aspect of the present invention comprises: a first substrate including an element; a first plug penetrating through the first substrate, made of a conductive material, and electrically connected with the element; a second substrate provided above the first substrate, and electrically connected with the element via the first plug; and a second plug penetrating through the first substrate, made of a non-dielectric material, and being not electrically connected with the second substrate.

A method of manufacturing a semiconductor device according to another aspect of the present invention comprises: forming a trench on a surface of a substrate and a thin-walled portion, the thin-walled portion being formed by removing at least part of the surface of an edge portion of the substrate to a depth greater than the depth of the trench; forming a plug in the trench; polishing the substrate from the back surface of the substrate until the thin-walled portion is disappeared; and projecting the plug from the back surface of the substrate by thinning the substrate from the back surface of the substrate.

A method of manufacturing a semiconductor device according to another aspect of the present invention comprises: forming a trench on a surface of a substrate and a thin-walled portion, the thin-walled portion being formed by removing at least part of the surface of an edge portion of the substrate deeper than the depth of the trench; forming a plug in the trench; polishing the substrate from the back surface of the substrate until the thin-walled portion is disappeared; and projecting the plug from the back surface of the substrate by thinning the substrate from the back surface of the substrate.

DETAILED DESCRIPTION OF THE INVENTION

Figure 12C:
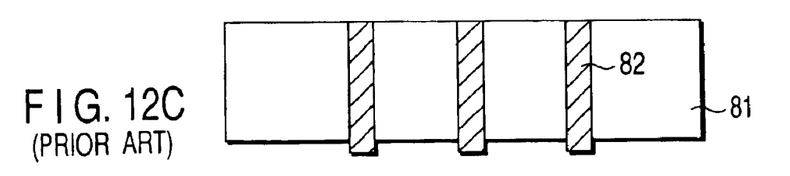

First, the following is a description of the problem found by the present inventors in the method of forming the conventional chip through plug shown in FIGS. 12A to 12C.

Figure 10:
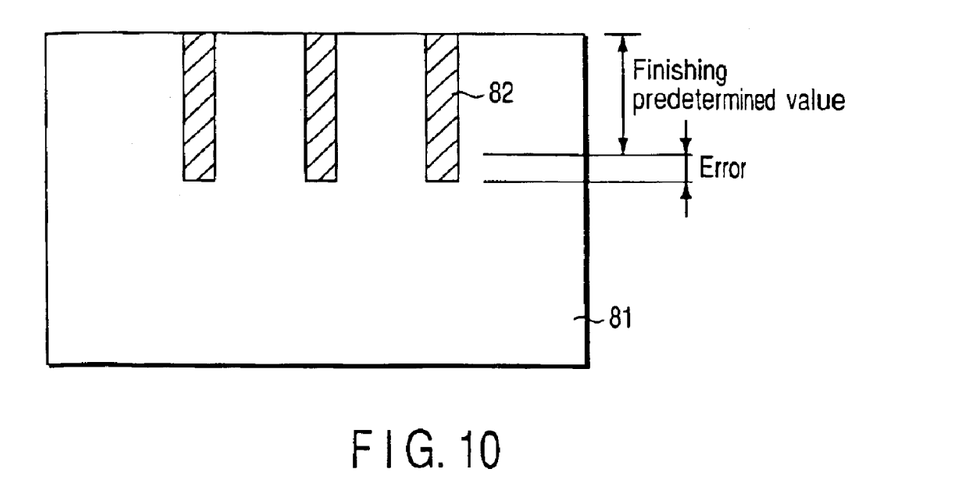
FIG. 10 is a cross-sectional view to explain a problem in a method of forming the chip through plug.

As seen from FIG. 10, the length of the metal plug 82 manufactured in the wafer process includes an error to a finishing predetermined value. In this case, the metal plug 82 is not seen from the outside; for this reason, it is impossible to measure the length of the metal plug 82. FIG. 10 shows an example that the metal plug 82 becomes longer than the finishing predetermined value.

Assembly conditions such as connection and seal change depend on the shape of the metal plug 82. For this reason, the projection of the metal plug 82 becomes uneven, and non-uniformity occurs in the shape of the metal plug 82; as a result, the assembly process after that is greatly affected. This is a factor of connection failure and the reduction of reliability, and these cause reduction of yield.

Figure 11A:
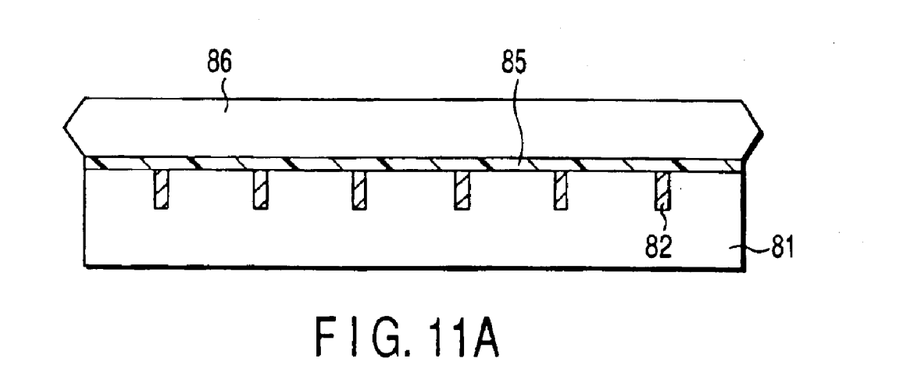
FIGS. 11A to 11C are cross-sectional views to explain a problem in a process of forming the chip through plug.
Figure 11B:
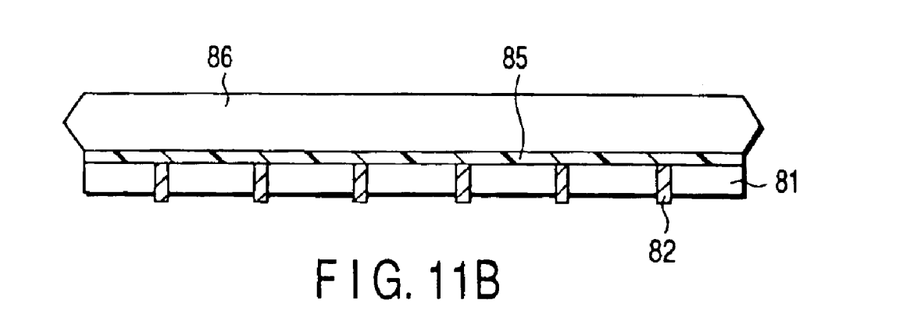
Figure 11C:
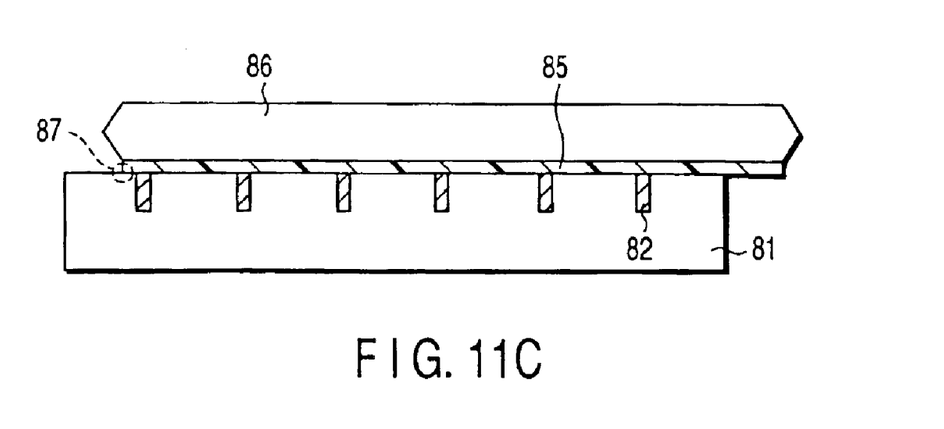

The present inventors have proposed a method of using a dummy substrate (dummy wafer) shown in FIGS. 11A to 11C in order to prevent an increase of cost when thinning Si substrate (Si wafer) 81 from the back surface.

According to the above method, as shown in FIG. 11A, a Si substrate 81 is fixed on a dummy substrate (temporary fixed substrate) 86 via a grinding tape 85. Thereafter, as illustrated in FIG. 11B, the substrate thickness 81 is thinned from the back surface of the Si substrate 81. The dummy substrate 86 is used as the temporary fixed substrate, and thereby, it is possible to reduce the cost.

However, the present inventors have found the following problems in the above method.

FIG. 11A shows the state that the Si substrate 81 and dummy substrate are bonded without aligned error. However, actually, the Si substrate 81 and the dummy substrate 86 are same in a diameter; for this reason, alignment error occurs as seen from FIG. 11C.

As a result, in the process of thinning the substrate from the back surface of the Si substrate 81, a great load is applied to a portion 87 of the Si substrate 81 below the edge portion of the dummy substrate 86, and the Si substrate 81 cracks. This cause reduction of yield. In addition, as the grinding tape 85 is used, a problem arises such that non-uniformity occurs in the back surface ground thickness, as in the conventional method shown in FIG. 13.

Considering the above problems, the embodiments of the present invention will be described below with reference to the accompanying drawings.

First Embodiment

Figure 1:
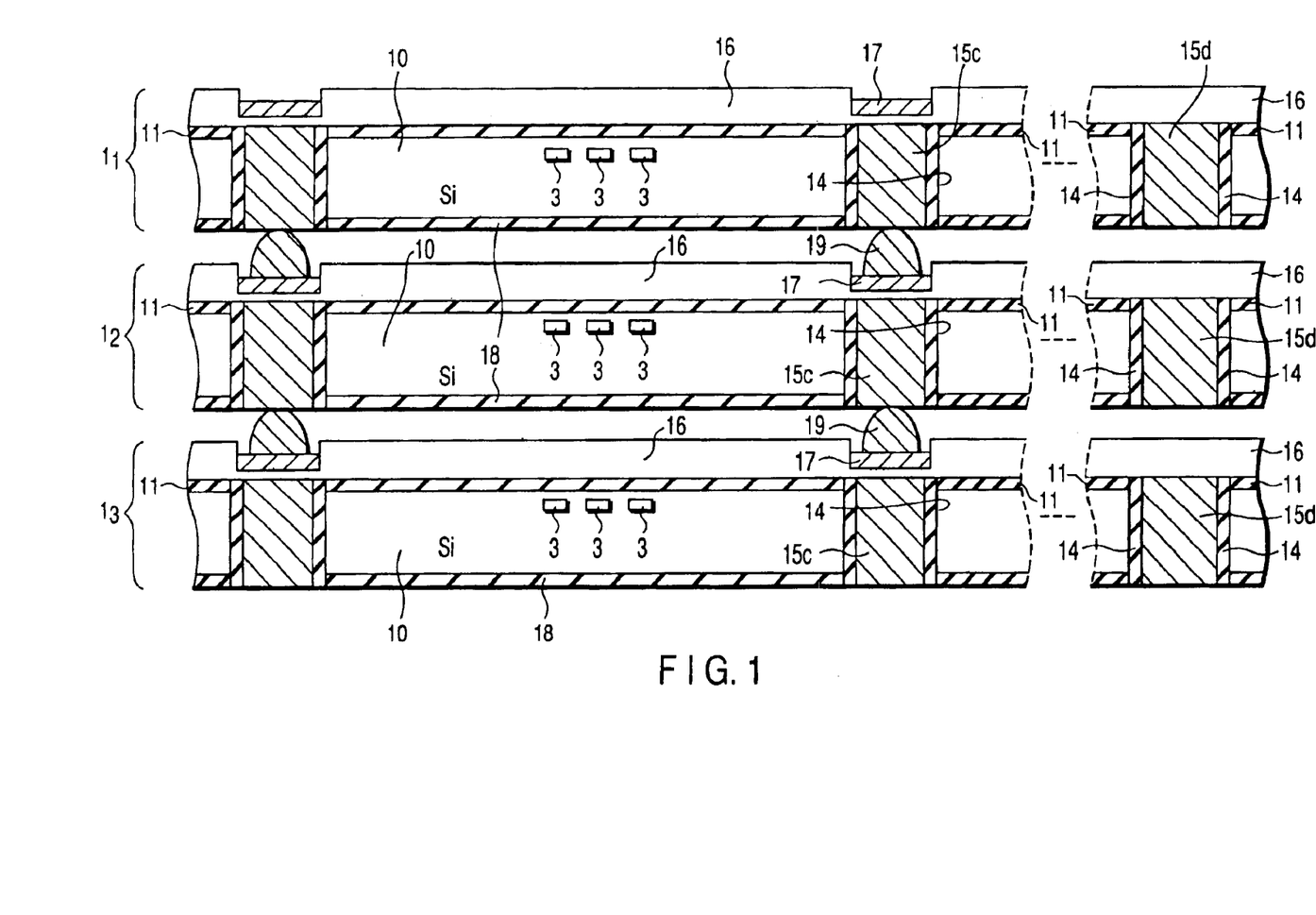
FIG. 1 is a cross-sectional view showing a multi-chip semiconductor device according to a first embodiment of the present invention.

FIG. 1 is a cross-sectional view showing a chip direct-laminated type multi-chip semiconductor device according to the first embodiment of the present invention.

The multi-chip semiconductor device according to the first embodiment has a structure in which three chips $1_1$, $1_2$ and $1_3$ are laminated. Each of the chips $1_1$, $1_2$ and $1_3$ comprises a Si substrate 10, a dielectric film 11, a multi-layer interconnection layer 16, and metal plugs 15c and 15d. The Si substrate 10 is configured so that elements such as MOS transistors and capacitors are integrated and formed on the surface. The dielectric film 11 covers the elements on the substrate. The multi-layer interconnection layer 16 connects the integrated and formed elements so that a predetermined relationship can be formed. The metal plug 15c is used as a chip through plug for electrically connecting the chips to each other. On the other hand, the metal plug 15d is used as a detecting section when grinding the back surface of the Si substrate 10.

The metal plug 15d is not used to electrically connect the chips to each other. The present invention structurally differs from the conventional multi-chip semiconductor device in that the above-mentioned metal plug 15d is included.

As described latter, the metal plug 15d is a thickness detecting plug, which is used to detect the thickness of the Si substrate in the manufacturing process of the multi-chip semiconductor device.

The metal plug 15d does not transmit a laser beam; in other words, it absorbs the laser beam. Any material other than metal may of course be used so long as the used material has the above properties. For example, a semiconductor is given as this kind of material. In the multi-chip semiconductor device using the plug (semiconductor plug) comprising the semiconductor, the metal plug 15d shown in FIG. 1 is substituted for the semiconductor plug.

The multi-layer interconnection layer. 16 includes a first interlayer dielectric film, a first interconnection layer, a second interlayer dielectric film, and a second interconnection layer. The first interconnection layer is connected to elements via the first interlayer dielectric film and a first connection hole opened in the dielectric film 11. The second interlayer dielectric film is formed on the first interlayer dielectric film so as to cover the first interconnection layer. The second interconnection layer is connected with the first interconnection layer via a second connection hole opened in the second interlayer dielectric film. In this case, multi-layer, that is, three-layer or more interconnection layers may be employed.

The metal plug 15c is formed outside the element forming region, and the metal plug 15d is formed outside the metal plug 15c. A dielectric film 14 is provided between the metal plugs 15c; 15d and a through hole in which these metal plugs are buried.

The chip through plug and the detecting section main body are the metal plug 15c and the metal plug 15d, respectively. The above dielectric film 14 constitutes the chip through plug and the detecting section.

If the material of the metal plug 15c is Cu (copper), in order to prevent the diffusion of Cu, a film (barrier metal film) is formed on the inner wall of the through hole. In this case, the barrier metal film also constitutes the chip through plug and the detecting section.

Each multi-layer interconnection layer 16 of the chips $1_1$, $1_2$ and $1_3$ is provided with a pad 17. The back surface of the Si substrate 10 is coated with a dielectric film 18.

The metal plug 15c of the chip $1_1$ is electrically connected to the pad 17 provided on the multi-layer interconnection layer 16 of the chip $1_2$ via a solder bump 19. Therefore, the chip $1_1$ is electrically connected to the chip $1_2$. In this case, bumps other than the solder bump 19 may be used.

Likewise, the metal plug 15c of the chip $1_2$ is electrically connected to the pad 17 provided on the multi-layer interconnection layer 16 of the chip $1_3$ via the solder bump 19. Therefore, the chip $1_2$ is electrically connected to the chip $1_3$. In the above manner, electrical connection is made between the chips $1_1$, $1_2$ and $1_3$.

The above first embodiment describes the case where the number of chips is three; in this case, four or more chips can be connected in the same manner as above. All of the chips having the metal plug 15c are not always connected via the metal plug 15c. More specifically, a chip, which is formed with the metal plug 15c may be employed for the purpose of improving heat radiation.

The method of manufacturing the multi-chip semiconductor device of the first embodiment will be described below with reference to FIGS. 2A to 2J.

Figure 2A:
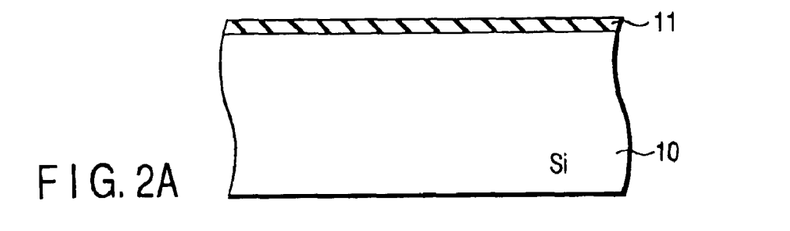
FIGS. 2A to 2J are cross-sectional views showing the manufacturing process of the multi-chip semiconductor device according to a first embodiment of the present invention.

As shown in FIG. 2A, a Si substrate 10 having a thickness of about 600 to 700 $\mu$m is prepared. The Si substrate 10 is already formed with elements, and the surface is coated with the dielectric film 11. Materials capable of taking etching selectively to $SiO_2$ such as silicon nitride are selected as the material of the dielectric film 11.

Figure 2B:
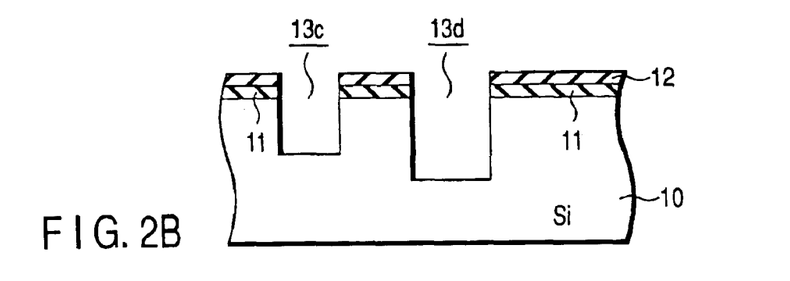

As depicted in FIG. 2B, a $SiO_2$ mask pattern 12 having a thickness of 1 $\mu$m is formed on the dielectric film 11. Thereafter, using the mask pattern 12 as a mask, the dielectric film 11 and the Si substrate 10 is etched by RIE process using an F-based gas as a etching gas so as to form trenches 13c and 13d. The trenches 13c and 13d penetrate through the dielectric film 11, and do not penetrate through the Si substrate 10.

The depth of the trench 13c is about 100 $\mu$m. The depth of the trench 13d is deeper than that of the trench 13c. In this case, it is possible to form the trench 13d deeper than the trench 13c by only changing the hole opening diameter or shape of the trench 13d. This is because the etching rate is different depending on the hole opening diameter and the shape of the trench.

For example, if the RIE process is employed, the hole opening diameter of the trench 13d is made wider than that of the trench 13c, and the hole opening area of the trench 13d is made wider than that of the trench 13c. By doing this, it is possible to make the trench 13d deeper than the trench 13c by the micro loading effect.

The relationship in depth between the trenches 13c and 13d can be estimated from previously conducted experimental results. As described above, if the depth is changed depending the difference of the hole opening diameter, the wider the hole opening diameter is, the higher the etching rate becomes.

Considering the above result, etching rate relevant to several different hole-opening diameters is acquired from the experiment, and thereby, the etching rate of an arbitrary hole opening diameter is determined by calculation such as interpolation.

Therefore, the absolute value of the depth of the trenches 13c; 13d changes depending on etching time (etching condition). However, if the etching time of the trenches 13c and 13d is the same, the difference in depth can be seen between the trenches 13c and 13d having difference hole opening diameter.

In the first embodiment, the trenches 13c and 13d have been formed in the same process; in this case, they may be formed in the process independently from each other. However, judging from the viewpoint of approximately making constant the difference in depth between the trenches 13c and 13d, it is preferable that the trenches 13c and 13d are formed in the same process.

Figure 2C:
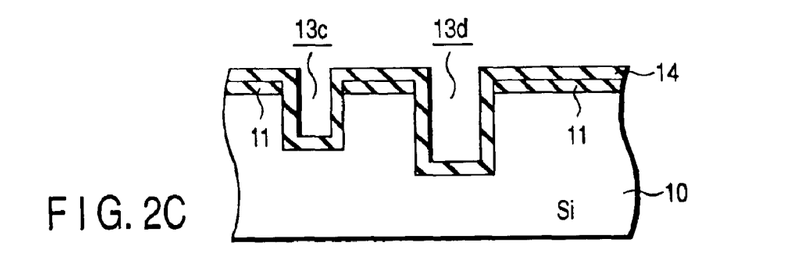

Annealing is carried out in order to restore the defect of the Si substrate 10 caused in the process of the trenches 13c and 13d. Thereafter, the dielectric film 14 is deposited on the entire surface so as to coat the inner wall of the trenches 13c and 13d, as shown in FIG. 2C. In this case, the dielectric film 14 is a $SiO_2/Si_3O_4$ laminated film, which is successively deposited by employing the LPCVD process. Further, the dielectric film 14 may be a single layer.

Figure 2D:
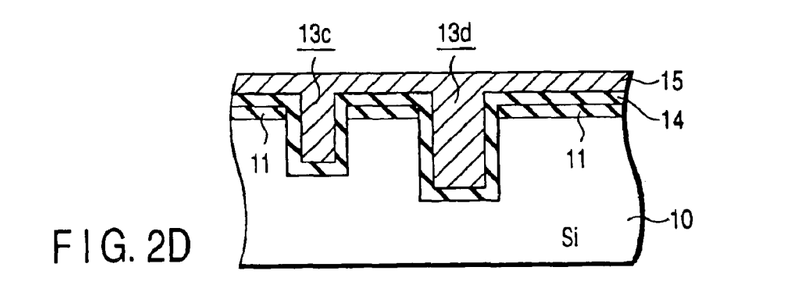

As illustrated in FIG. 2D, a metal film 15 which to be the metal plugs 15c and 15d is formed on the entire surface by the thickness overflowing from the trenches 13c and 13d, and thus, the trenches 13c and 13d are filled with the metal film 15.

In this case, W, Mo, Ni, Ti Cu films or metal silicide films of those are given as the metal film 15. CVD method, sputtering method or plating method is given as the method for forming the metal film 15.

Figure 2E:
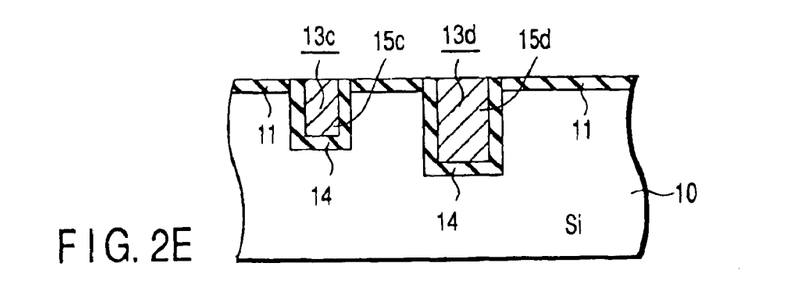

As seen from FIG. 2E, using CMP or etch back, the metal film 15 and the dielectric film 14 are thinned until the surface of the dielectric film 11 is exposed, and thus, metal plugs 15c and 15d are formed. Thereafter, the multi-layer interconnection layer 16 is formed.

Figure 2F:
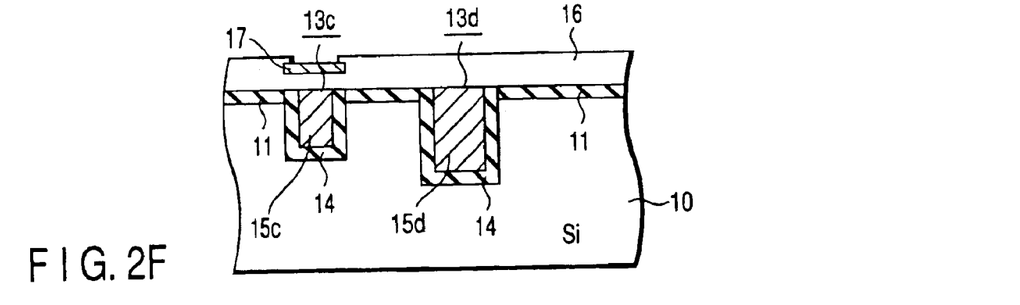

As shown in FIG. 2F, a trench is formed on the surface of the multi-layer interconnection layer 16, and the pad 17 is provided on the bottom surface of the trench so that it can be exposed.

Figure 2G:
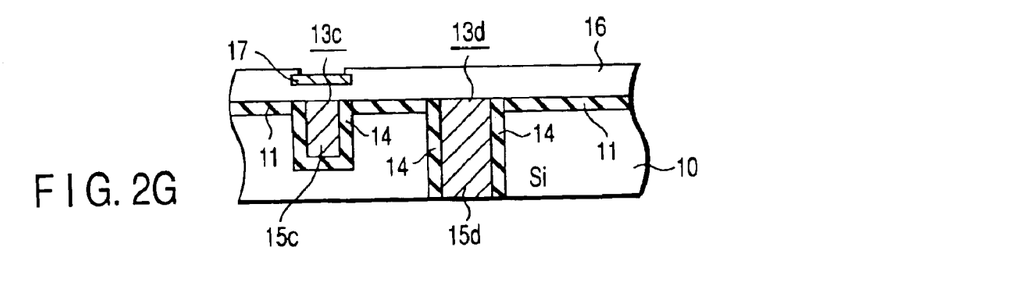

As seen from FIG. 2G, the back surface of the Si substrate 10 is ground by mechanical polishing with grinding wheel until the metal plug 15d is exposed. More specifically, the back surface of the Si substrate 10 is ground My mechanical polishing with grinding wheel while monitoring the back surface of the Si substrate 10 by image recognition in situ. When the monitor detects the exposure of the metal plug 15d, the operation of grinding the back surface of the Si substrate 10 is stopped, and thereby, the structure shown in FIG. 2G is obtained.

In the above process, there is no need to measure the total thickness of the Si substrate 10 and the grinding tape, using the contact type thickness monitor. It is necessary to make thin the Si substrate 10 from the back surface until the metal plug 15d is exposed. This serves to prevent non-uniformity by grinding the Si substrate 10 from the back surface while monitoring the back surface of the Si substrate 10 as described above.

In the first embodiment, back surface grinding by grinding wheel is completed when the metal plug 15d is exposed. The back surface grinding by grinding wheel may be completed when the dielectric film 14 under the metal plug 15d is exposed.

Figure 2H:
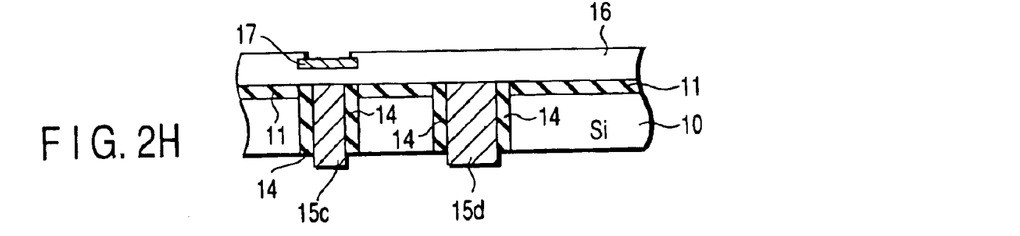

As shown in FIG. 2H, the dielectric film 14 under the metal plug 15c is removed. The Si substrate 10 is thinned from the back surface using CMP and etching until the metal plugs 15c and 15d project from the back surface of the substrate by several $\mu$m.

More specifically, CMP is carried out until the back surface of the substrate including metal plugs 15c and 15d is flatted, thereafter, the substrate (Si) is thinned from the back surface by selectively etching the back surface by wet or dry etching so that the metal plugs 15c and 15d project from the back-surface of the substrate by several $\mu$m.

The difference in depth between the trenches 13c and 13d can be estimated from the difference of the hole opening diameter, as described before. The Si substrate 10 is thinned from the back surface by the substrate thickness (predetermined amount) corresponding to the depth from the trench 13d to the trench 13c, and thereby, the metal plug 15c is exposed.

Therefore, in order to set the projection of the metal plugs 15c and 15d to several $\mu$m, the substrate may be thinned by a further several $\mu$m from the above predetermined amount. Using the above CMP and etching can uniformly set the projection.

In FIG. 2H, the metal plugs 15d and 15c has the same length. The reason is because when CPM is employed, polishing is carried out until the metal plugs 15d and 15c become the same length, thereafter, the metal plugs 15d and 15c are polished by the same amount.

In this case, the metal plugs 15d and 15c are not always projected from the back surface of the substrate, and the back surface of the substrate including the metal plugs 15d and 15c may be merely made flat by CMP.

If wet or dry etching is employed, the metal plugs 15d and 15c are etched by the same amount; therefore, the metal plug 15d becomes longer than the metal plug 15c. If the difference in-length between the metal plugs 15d and 15c is within an allowable range, wet or dry etching may be employed in place of the above CMP.

In the manner described above, according to the first embodiment, it is possible to sufficiently reduce non-uniformity in the projection and shape of the metal plugs 15c and 15d. Further, the non-uniformity in the projection and shape is sufficiently reduced; therefore, it is possible to solve the problem in the assembly process resulting from the non-uniformity, for example, connection failure and reduction of reliability and yield.

In the conventional process shown in FIG. 12, etching or CMP is carried out while monitoring the back surface of the substrate in situ, and the monitor detects the exposure of the metal plugs. Thereafter, the back surface of the substrate is further thinned by several $\mu$m with the use of etching or CMP. By doing this, it is unnecessary to monitor the back surface thickness ground by grinding wheel using the contact type thickness monitor in the process of FIG. 12B. Consequently, it seems as if the above non-uniformity problem is solved.

However, if mechanical polishing by grinding wheel is carried out without monitoring the back surface thickness, it is impossible to stop the grinding operation directly before the metal plug is exposed. For this reason, in the process of FIG. 12B, the projection is not controlled at all; as a result, there is the possibility that the metal plug is projected.

Conversely, in the process of FIG. 12B, in order to prevent the projection of the metal plug, mechanical polishing by grinding wheel is stopped too early. In this case, in etching after that, the etching rate is lower about two digits as compared with mechanical polishing by grinding wheel. For this reason, too much time is taken in the process of FIG. 12C; as a result, productivity becomes worse. Therefore, the method of the first embodiment is further effective because it is possible to control the back surface thickness in mechanical polishing by grinding wheel having higher rate.

Figure 2I:
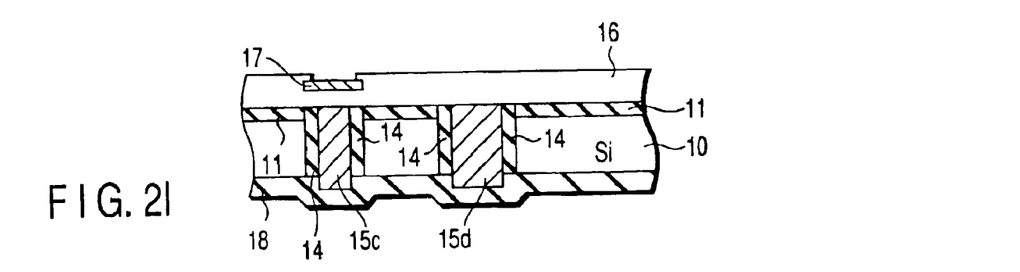

As shown in FIG. 2I, a dielectric film 18 such as $SiO_2$ film is formed on the back surface of the Si substrate 10 with the use of plasma CVD process so as to cover the metal plugs 15c and 15 projecting from the back surface of the substrate.

Figure 2J:
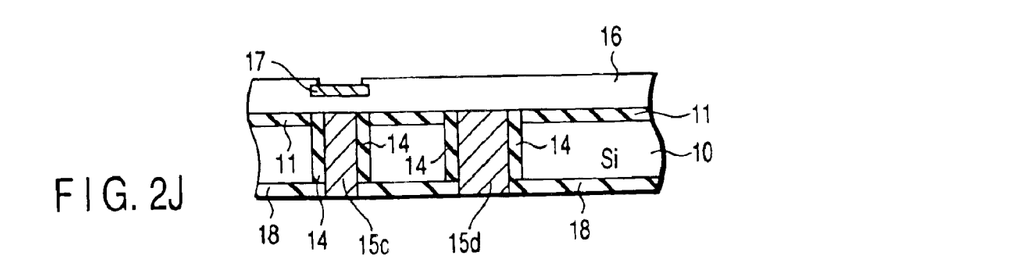

As illustrated in FIG. 2J, the dielectric film 18 is polished with the use of the CMP process until the metal plugs 15c and 15d are exposed. Thereafter, a solder bump 19 is formed on the pad 17.

According to the above method of forming the chip, the chips $1_1$, $1_2$ and $1_3$ are formed. Thereafter, the chips $1_1$ and $1_2$ and the chip $1_2$ and $1_3$ are respectively connected, and thereby, the multi-chip semiconductor device shown in FIG. 1 is obtained.

If there is no need to cover the back surface of the Si substrate 10 with the dielectric film 18, the process sequence proceeds to the above process for making the connection between the chips after the process of FIG. 2H.

In the first embodiment, the same material as the chip through plug, that is, the metal plug 15c is used as the material of the metal plug 15d of the detecting section. In this case, different materials may be used. For example, a dielectric material such as $SiO_2$ and a semiconductor material such as polysilicon may be used. The trench 13d, which is not filled with metal may be used as the detecting section.

If the dielectric material is used, the hole opening diameter of the trench 13d is smaller than that of the trench 13c, and thereby, the trench 13d can be readily filled with the dielectric material (dielectric film). However, in this case, the hole opening area of the trench 13d is set wider than that of the trench 13c so that the trench 13d becomes deeper than the trench 13c. This can be achieved by making long the dimension of the trench 13d shown in FIG. 2B in the vertical direction to the paper.

The process for thinning the Si substrate 10 of FIGS. 2G to 2H may be made every wafer or unit of chip. In addition, the following method may be employed. That is, with the use of a process called pre-dicing, trenches are previously formed at the surroundings of each chip on the wafer. During the process for thinning the wafer, the wafer is separated into each chip.

Figure 3A:
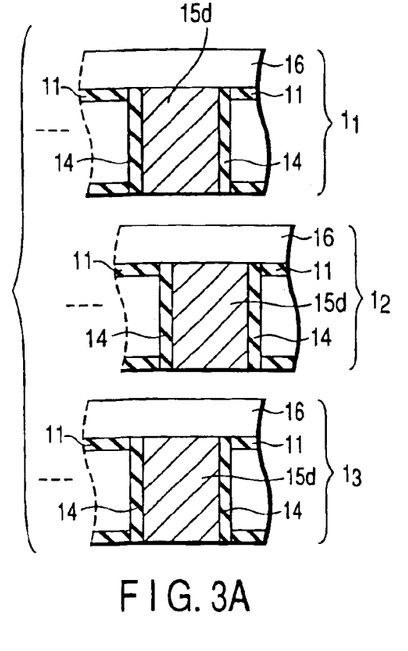
FIGS. 3A and 3B are cross-sectional views showing another structure of a metal plug of a detecting section.
Figure 3B:
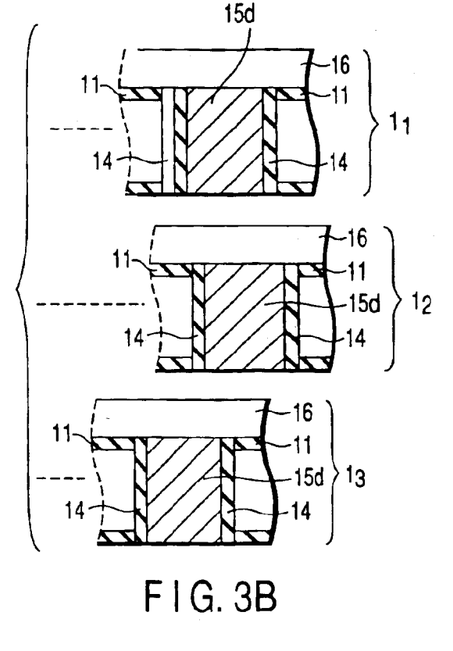

In the first embodiment, as seen from FIG. 1, the centers of each metal plug 15d of the chips $1_1$, $1_2$ and $1_3$ are aligned. The centers of each metal plug 15d may not be aligned as illustrated in FIGS. 3A and 3B. FIG. 3A shows the example in which one metal plug 15d is different in its center from the remaining two metal plugs 15d. FIG. 3B shows the example in which the center of all metal plugs 14d are shifted.

Second Embodiment

Figure 4A:
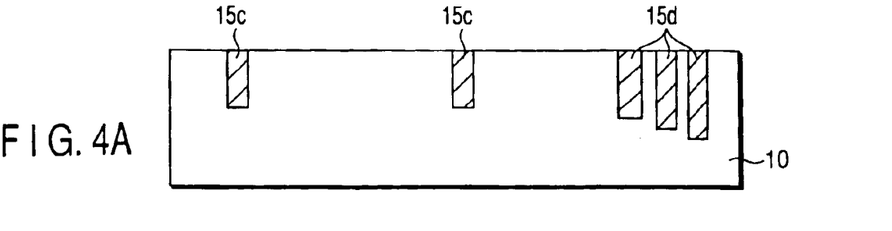
FIGS. 4A to 4C are cross-sectional views showing the manufacturing process of a chip of a multi-chip semiconductor device according to a second embodiment of the present invention.
Figure 4B:
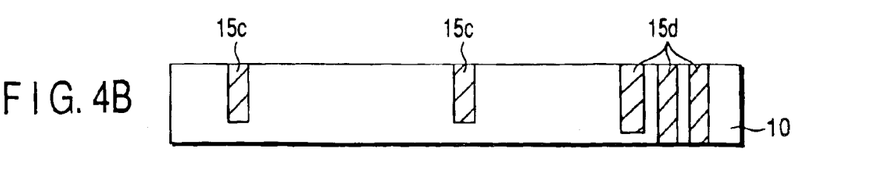
Figure 4C:
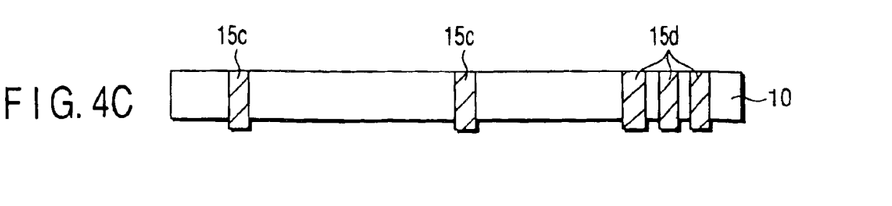

FIGS. 4A to 4C are cross-sectional views showing the manufacturing process of a chip of a multi-chip semiconductor device according to a second embodiment of the present invention.1

FIG. 4A is equivalent to FIG. 2E, and FIG. 4B is equivalent to FIG. 2G. For simplification of explanation, only Si substrate 10 and metal plugs 15c; 14d are shown. The same reference numerals as FIG. 1 and FIGS. 2A to 2J are used to designate the portions corresponding to FIG. 1 and FIGS. 2A to 2J, and the details are omitted. Likewise, in the following drawings after FIGS. 5A and 5B, the same reference numerals as the preceding drawings are used to designate the portions corresponding thereto, and the details are also omitted.

The second embodiment differs from the above first embodiment in that a plurality of metal plugs 15d having different depths (lengths) is used as the detecting section, as seen from FIG. 4A. Similar to the case where the metal plug 15d is formed deeper than the metal plug 15c, the plurality of metal plugs 15d having different depths is formed in the following manner. That is, it is possible to form the metal plugs only by changing the hole opening diameter and area of the trenches in which these plugs are buried. In FIGS. 4A to 4C, the metal plugs 15d becomes longer in succession from the left; in this case, these plugs may be arrayed regardless of the order.

As shown in FIG. 4B, the back surface of the Si substrate 10 is mechanically ground by grinding wheel. Thereafter, the number of the metal plugs 15c exposed from the back surface of the Si substrate 10 is detected so that the thickness of the Si substrate 10 after grinding is estimated. By doing so, it is possible to accurately determine how long the Si substrate 10 should be thinned by etching or CMP in the next process in order to expose the metal plug 15c.

For example, if the lengths of the metal plugs 15d are 110 $\mu$m, 115 $\mu$m and 120 $\mu$m in short length sequence, two metal plugs 15d are exposed in FIG. 4B. Therefore, the thickness of the Si substrate 10 after grinding is thicker than 110 μm and less than 120 μm.

If the length of the metal plug 15c is 100 μm, the back surface of the Si substrate 10 is etched by etching or CMP so that the Si substrate 10 can be thinned by 15 μm (predetermined amount). By doing so, the metal plug 15c is exposed (see FIG. 4C). If the projection from the back surface of the substrate of the metal plug 15c; 15d is set to several μm, the Si substrate 10 may be further thinned by several μm.

According to the second embodiment, the number of the metal plug 15c exposed on the back surface of the Si substrate 10 is detected after the grinding process of the Si substrate 10 shown in FIG. 4B. Namely, an effect that there is no need of monitoring the back surface of the Si substrate 10 in the grinding process of the Si substrate 10 in FIG. 4B is obtained. In addition, the number of the metal plugs 15d having different depths (lengths) is increased, and thereby, it is possible to make further accurate estimation.

In this case, the following methods are given as the method of detecting the number of the metal plugs exposed on the back surface of the Si substrate 10. There are a method of using image recognition, a method of chemically analyzing the material of the metal plug 15d, a method of controlling a torque in grinding and the like.

Figure 5A:
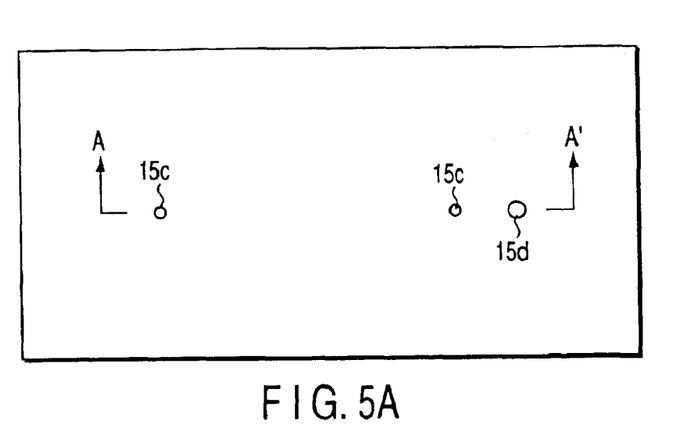
FIGS. 5A to 5C are top plan views showing the arrangement of a metal plug (chip through plug) and a metal plug (detecting section)
Figure 5B:
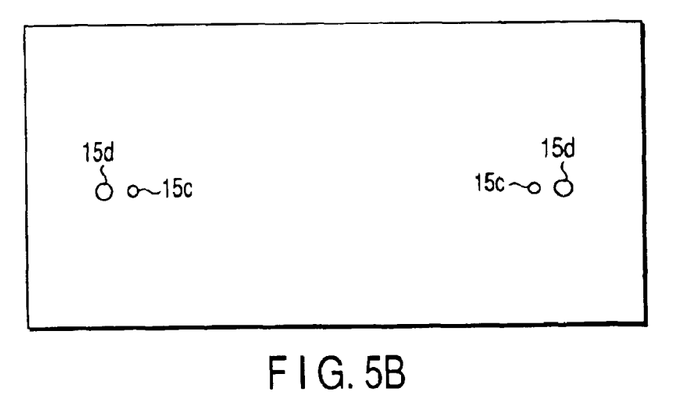

FIGS. 5A to 5C and FIGS. 6A to 6C are top plan views showing the arrangement of the metal plugs 15c and 15d in the first and second embodiments. FIG. 5A shows the arrangement where the metal plug 15d is one, and the cross-sectional view of FIG. 1 is equivalent to the cross-sectional view taken along an arrow line A–A' of FIG. 5A. FIG. 5B shows the arrangement where the metal plug 15d is provided outside each of two metal plugs 15c.

Figure 5C:
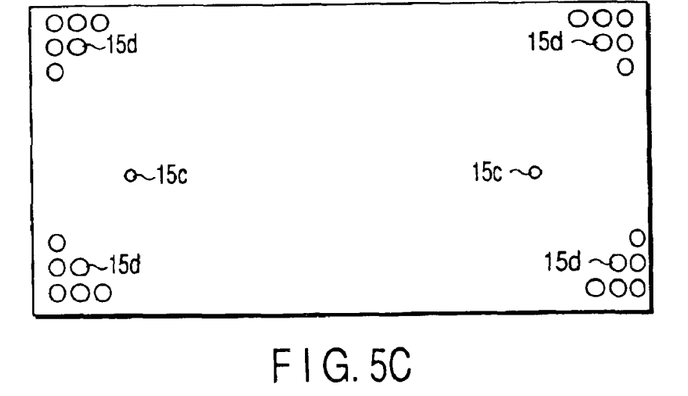

FIG. 5C shows the arrangement where several metal plugs 15d are provided at each of four corners of the chip. The above several metal plugs 15d have different depths (lengths) on the way of manufacture, like the second embodiment. The metal plugs 15d are not necessarily provided at all of four corners; in this case, the metal plugs 15d may be provided at one of the corners.

In general, the chip used for the multi-chip is thin; for this reason, occasionally, the chip is easy to peel from the corner portion. As depicted in FIG. 5C, several metal plugs 15d are provided at each of four corners of the chip, and thereby, the warp of the corner portion of the chip is reduced so that peeling of the chip can be prevented. In either case of FIG. 5A and FIG. 5B, the number of plugs penetrating through the substrate is increased, and thereby, the warp of the chip is reduced.

The metal plug 15d is exposed on the back surface of the Si substrate 10 so that it can be used as an alignment mark in bonding the back surface of the chip. In the second embodiment, various modifications are possible like the above first embodiment. For instance, a trench may be used in place of the metal plug 15d.

Figure 6A:
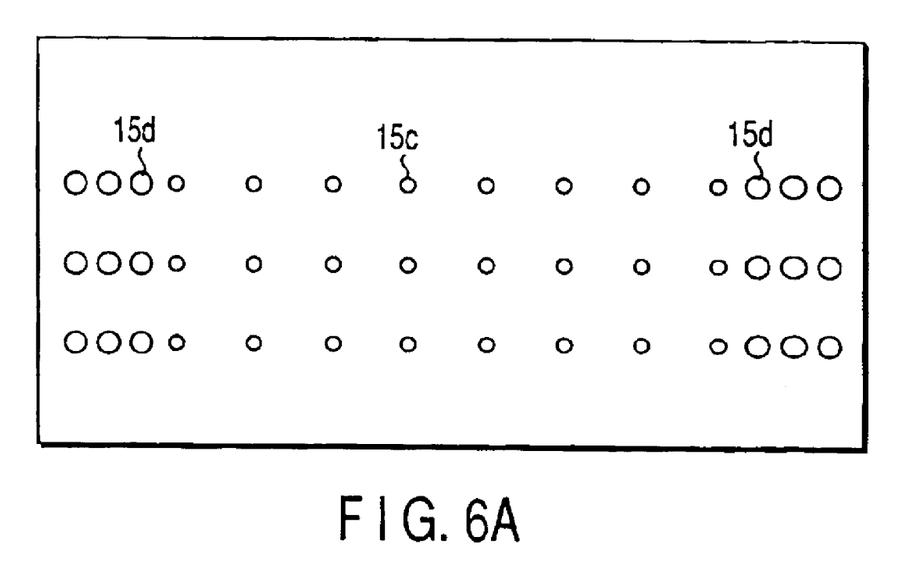
FIGS. 6A and 6B are top plan views showing the arrangement of another metal plug (chip through plug) and a metal plug (detecting section)
Figure 6B:
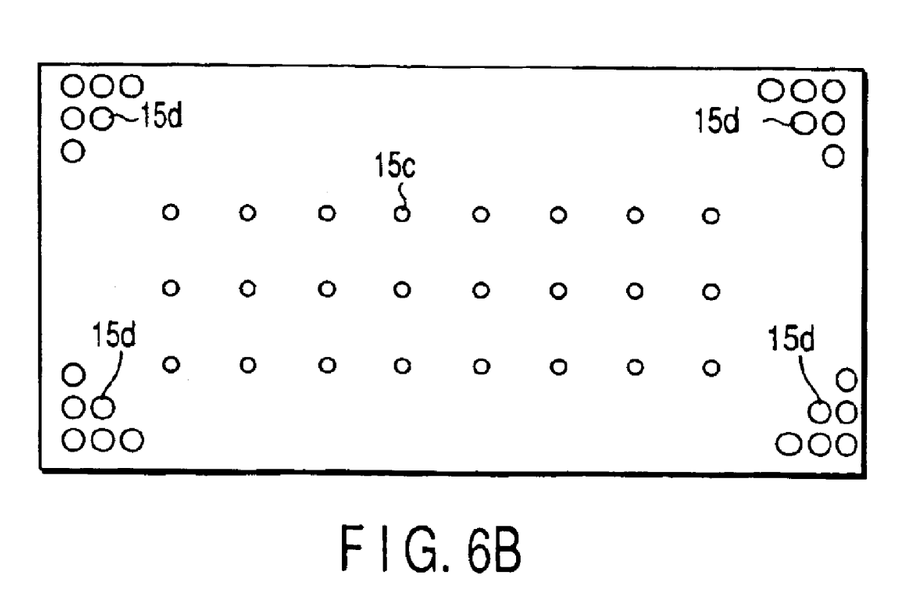

FIGS. 6A and 6B show the arrangement where the number of the metal plugs 15c is more than three, and are equivalent to FIGS. 5A and 5B, respectively.

Third Embodiment

Figure 7A:
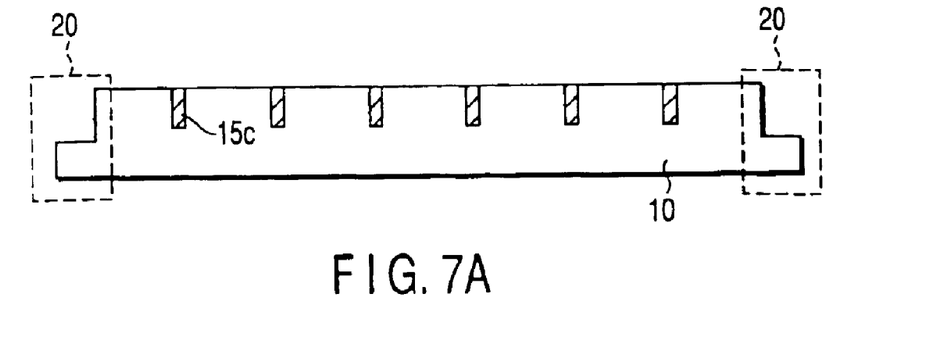
FIGS. 7A to 7C are cross-sectional views showing the manufacturing process of a chip of a multi-chip semiconductor device according to a third embodiment of the present invention.
Figure 7B:
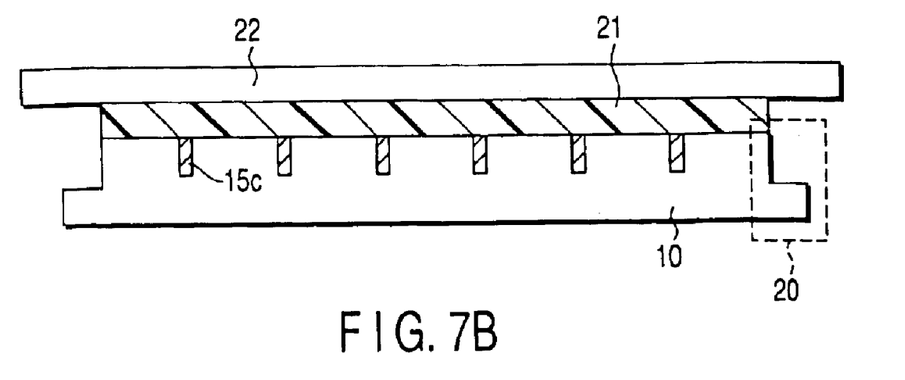
Figure 7C:
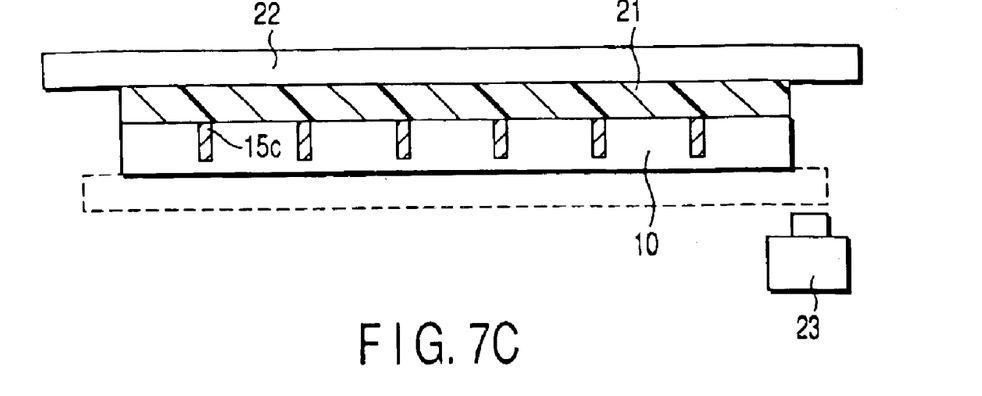

FIGS. 7A to 7C are cross-sectional views showing the manufacturing process of a chip of a multi-chip semiconductor device according to a third embodiment of the present invention.

According the third embodiment, as seen from FIG. 7A, a thin-walled portion 20 used for detecting the thickness of the Si substrate 10 is formed at the edge portion of the Si substrate 10. The thin-walled portion 20 is monitored, and thereby, the completion of mechanical polishing is detected. The thin-walled portion 20 has a ring shape in its plane.

The following methods of forming the thin-walled portion 20 are given. For example, according to one method, when forming the trench in which the metal plug 15c is buried by etching, the edge portion of the Si substrate 10 is simultaneously etched so that the above thin-walled portion 20 can be formed. In this case, the thin-walled portion 20 is formed so that its surface can be made lower than the bottom surface of the trench. The above etching is carried out using a resist pattern as a mask. According to another method, after the metal plug 15c is formed, the edge portion of the Si substrate 10 is etched so that the thin-walled portion 20 can be formed. In FIG. 7, for simplification of illustration, the multi-layer interconnection layers and the like are omitted, and only Si substrate 10 and metal plugs 15c; 15d are shown.

The thin-walled portion 20 is obtained by removing the surface of the edge portion of the Si substrate 10. Thus, in the third embodiment, cost is advantageously reduced as compared with the first and second embodiments of forming the metal plug 15d in the chip.

As shown in FIG. 7B, a grinding tape 21 is stuck onto the surface of the Si substrate 10, and further, a grinding table 22 is placed on the grinding tape 21.

As illustrated in FIG. 7C, the back surface of the Si substrate is mechanically ground by grinding wheel. In this case, an image recognition monitor 23 observes the thin-walled portion 20, and grinding is completed when the thin-walled portion is disappeared.

In this case, there is no need of measuring the total thickness of the Si substrate 10 and the ground tape 21 with the use of the contact type thickness monitor. As described before, the Si substrate 10 is thinned from the back surface until the thin-walled portion 20 is disappeared. The Si substrate 10 is ground while monitoring the thin-walled portion 20 by the image recognition monitor 23, and thereby, the back surface of the Si substrate 10 is uniformly ground.

In addition, the difference between the distance from the substrate back surface to the upper surface of the thin-walled portion 20 and the depth of the trench in which the metal plug 15c is buried is approximately constant if etching time is the same, from the same reason as the case of the difference in depth between trenches 13c and 13d described in the first embodiment.

Therefore, the Si substrate 10 is thinned from the back surface by the difference (predetermined amount) between the distance from the substrate back surface to the upper surface of the thin-walled portion 20 and the depth of the trench in which the metal plug 15c, and thereby, the metal plug 15c is exposed. Thus, in order to set the projection of the metal plug 15c from the substrate back surface to several μm, the substrate is made thicker several μm than the above predetermined amount. This can be achieved by using etching or CMP without non-uniformity. In this case, the etching or polishing amount of the substrate by etching or CMP may be determined based on finishing estimated surface of the metal plug 15c and the distance from the substrate back surface to the upper surface of the thin-walled portion 20.

Consequently, according to the third embodiment, it is possible to sufficiently reduce non-uniformity of the projection and shape of the metal plug 15c. Further, the above non-uniformity of the projection and shape of the metal plug 15c is sufficiently reduced; therefore, it is possible to solve the problem in the assembly process resulting from the non-uniformity, for example, connection failure and reduction of reliability and yield.

In the third embodiment, the back surface of the Si substrate 10 is ground by grinding wheel and etching or CMP in a state that the Si substrate is temporally fixed onto the grinding table. In the light of reducing the manufacturing cost, the substrate (dummy substrate) having the same diameter and material as the Si substrate may be used. That is, if the Si substrate 10 is Si wafer, dummy Si wafer is employed.

Figure 8:
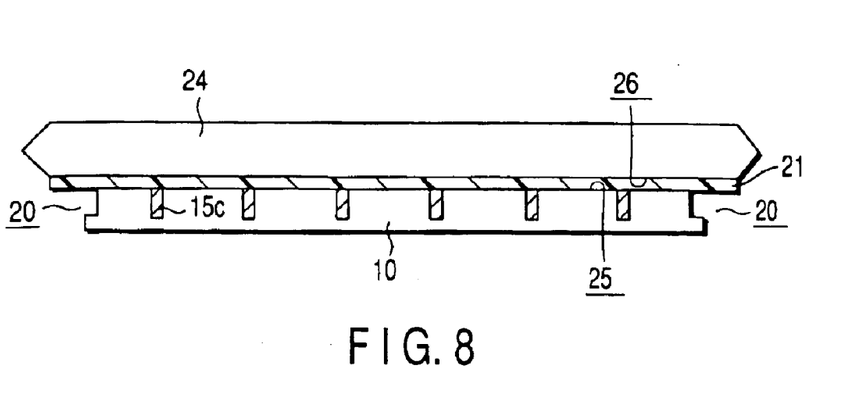
FIG. 8 is a cross-sectional view to explain a multi-chip semiconductor device using a dummy substrate in place of a grinding table in the third embodiment.

FIG. 8 is a cross-sectional view equivalent to FIG. 7B when using a dummy substrate 24. The Si substrate 10 is temporally fixed to the dummy substrate 24 via the grinding tape 21. The Si substrate 10 is formed with the thin-walled portion 20 at the edge portion. As a result, the diameter of a bonding surface 25 of the Si substrate 10 is smaller than that of a bonding surface 26 of the dummy substrate 24. Therefore, even if the alignment between the Si substrate 10 and the dummy substrate 24 is shifted, the bonding surface 25 of the Si substrate 10 ranges within the bonding surface 26 of the dummy substrate 24. This serves to solve the problem that the Si substrate 10 cracks in the process for thinning the Si substrate from the back surface.

Figure 9:
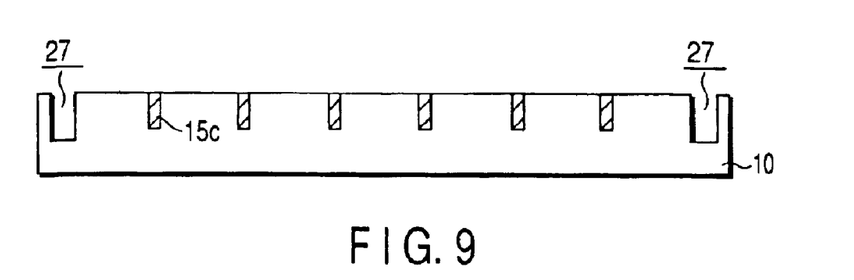
FIG. 9 is a cross-sectional view to explain a multi-chip semiconductor device using a trench in place of a thin-walled portion in the third embodiment.

In the third embodiment, the thin-walled portion 20 formed at the edge portion of the Si substrate 10 is used to detect the thickness of the Si substrate 10. As shown in FIG. 9, a trench 27 formed at the edge portion of the Si substrate 10 may be used. In this case, the trench 27 is formed deeper than the trench in which the metal plug 15c is buried. For instance, the top view shape of the trench 27 is ring shape.

The advantage of using the trench 27 is that it is possible to prevent chipping, which takes place when the edge portion of the Si substrate 10 becomes thin in grinding the back surface of the Si substrate 10.

If the trench in which the metal plug 15c is buried and the trench 27 are formed in the same process, the metal plug 15c is formed by plating in order to prevent the metal plug 15c from being buried in the trench 27. In this case, plating is carried out so that no metal thin film can be formed in the trench 27 as seed. For instance, this is achieved by forming metal thin film in a state of masking the trench 27.

If pre-dicing is employed, a trench for pre-dicing may be used as the trench 27. This is achieved by forming the trench for pre-dicing by RIE, and accurately controlling the depth of the trench. In this case, there is no need of newly forming the trench for detecting the chip thickness, so that the circuit area occupation rate of wafer can be enhanced.

The present invention is not limited to the above embodiments. For example, in the above embodiments, the Si substrate is used as the substrate; in this case, a SOI substrate, a strained Si substrate or a, substrate combining the SOI substrate and the strained Si substrate may be used. The material of the substrate is not limited to Si; in this case, SiGe may be used as the material.

To give an example of the multi-chip semiconductor device, the following semiconductor devices are given. One is a multi-chip semiconductor device laminating semiconductor memory chips such as NAND type EEPROM, NOR type EEPROM and DRAM. Another is a multi-chip semiconductor device laminating a chip, which comprises a semiconductor memory and a CPU so as to perform information processing.

The present invention is not limited to the chip direct-laminated type multi-chip semiconductor device. For example, the present invention is applicable to a semiconductor device in which one or two chips or more are mounted on the substrate. Further, the present invention is applicable to a semiconductor device including an interposer. In this case, in the semiconductor device, a first substrate is an interposer, and a second substrate is a chip mounted on the interposer. The semiconductor device further includes a third substrate connected to the chip (second substrate) via the interposer (first substrate).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first substrate including an element;
   a first plug penetrating through the first substrate, made of a conductive material, and electrically connected with the element;
   a second substrate provided above the first substrate, and electrically connected with the element via the first plug; and
   a second plug penetrating through the first substrate, made of a non-dielectric material, and being not electrically connected with the second substrate, wherein the non-dielectric material and the conductive material comprise the same metal.

2. The semiconductor device according to claim 1, wherein the first and second substrates are a chip.

3. The semiconductor device according to claim 1, wherein the first substrate is a chip, and the second substrate is a substrate for mounting the chip.

4. The semiconductor device according to claim 1, wherein the second plug is provided at a corner of the first substrate.

5. The semiconductor device according to claim 1, wherein the second plug is a plug for detecting a thickness of the first substrate.

6. The semiconductor device according to claim 1, further comprising: a bump provided between the first and second substrates, the first plug being connected to the element via the bump.

7. The semiconductor device according to claim 1, wherein the first and second substrates each include a multi-layer interconnection.

8. The semiconductor device according to claim 1, further comprising: third and fourth plugs penetrating through the second substrate, the third plug being made of a conductive material, and the fourth plug being made of a non-dielectric material.

9. The semiconductor device according to claim 8, wherein the first and third plugs are electrically connected to each other, and the second and fourth plugs are not electrically connected to each other.

10. The semiconductor device according to claim 8, wherein the first to fourth plugs are made of the same material.

11. A semiconductor device comprising:
    a first substrate including an element;
    a first plug penetrating through the first substrate, made of a conductive material, and electrically connected with the element;

a second substrate provided above the first substrate, and electrically connected with the element via the first plug; and a second plug for detecting a thickness of the first substrate, the second plug penetrating through the first substrate, made of a non-dielectric material, and being not electrically connected with the second substrate.

12. The semiconductor device according to claim 11, wherein the conductive material is metal, and the non-dielectric material is semiconductor.

13. The semiconductor device according to claim 11, wherein the first and second substrates are a chip.

14. The semiconductor device according to claim 11, wherein the first substrate is a chip, and the second substrate is a substrate for mounting the chip.

15. The semiconductor device according to claim 11, wherein the second plug is provided at a corner of the first substrate.

16. The semiconductor device according to claim 11, further comprising: a bump provided between the first and second substrates, the first plug being connected to the element via the bump.

17. The semiconductor device according to claim 11, wherein the first and second substrates each include a multi-layer interconnection.

18. The semiconductor device according to claim 11, further comprising third and fourth plugs penetrating through the second substrate, the third plug being made of a conductive material, and the fourth plug being made of a non-dielectric material.

19. The semiconductor device according to claim 18, wherein the first and third plugs are electrically connected to each other, and the second and fourth plugs are not electrically connected to each other.

20. The semiconductor device according to claim 18, wherein the first to fourth plugs are made of the same material.

* * * * *